(12) United States Patent
Lee

(10) Patent No.: US 6,207,490 B1
(45) Date of Patent: Mar. 27, 2001

(54) SEMICONDUCTOR DEVICE AND METHOD FOR FABRICATING THE SAME

(75) Inventor: Woon-Kyung Lee, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/209,993

(22) Filed: Dec. 10, 1998

(30) Foreign Application Priority Data

Dec. 11, 1997 (KR) .................................................. 97/67801

(51) Int. Cl.[7] .................................................. H01L 21/8242
(52) U.S. Cl. ..................... 438/241; 438/238; 438/275; 437/52; 257/306; 257/314
(58) Field of Search ..................... 438/241, 238, 438/275; 437/52; 257/314, 306

(56) References Cited

U.S. PATENT DOCUMENTS

| | | | |
|---|---|---|---|
| 4,977,099 | * 12/1990 | Kotaki | 437/52 |
| 5,015,601 | * 5/1991 | Yoshikawa | 437/67 |
| 5,866,456 | * 2/1999 | Abe | 438/275 |
| 6,060,738 | * 5/2000 | Kidaka et al. | 257/306 |
| 6,060,739 | * 5/2000 | Saitoh | 257/314 |
| 6,069,036 | * 5/2000 | Kim | 438/238 |

* cited by examiner

*Primary Examiner*—Amir Zarabian
*Assistant Examiner*—Pho Luu
(74) *Attorney, Agent, or Firm*—Marger Johnson & McCollom, PC

(57) ABSTRACT

There are provided a semiconductor device and a fabricating method thereof, in which a plurality of buried diffusion layers repeatedly extend on a semiconductor substrate and a plurality of word lines repeatedly extend on the buried diffusion layers, perpendicularly to the buried diffusion layers. The cross-sections of the word lines are shaped in asymmetrical polygons, with odd-numbered word lines having the same cross-section and the even-numbered word lines having the same cross-section. Narrow gate electrodes can be formed on the buried diffusion layers, using a spacer mask, so that the area of a memory cell array can be reduced by 50% and thus a cell integration level can be increased.

15 Claims, 13 Drawing Sheets

SEMICONDUCTOR DEVICE AND METHOD FOR FABRICATING THE SAME

BACKGROUND OF THE INVENTION

1. Field of the Invention

The present invention relates to a semiconductor device and a method for fabricating the same, and in particular, to a semiconductor device and a fabricating method thereof, which can maximize a cell integration level.

2. Description of the Related Art

Along with higher integration of semiconductor devices, reduction of pattern pitch, that is, circuit line width has become a significant interest in a semiconductor fabrication process. The decrease in the circuit line width plays an important role in shrinkage of semiconductor devices and is achieved by development of photolithography. That is, the circuit line width has been reduced by improving many parameters including the resolution of a photoresist used, the range of an optical wavelength used, and so on. For example, a 436-nm g-line was initially used but now a 365-nm i-line is currently used, for photolithography. In addition, a 248-nm KrF excimer laser will be used in the future. The resolution of a photoresist increases with the reduction of an optical wavelength and the increase in the aperture of an exposure equipment, and thus high integration and high capacity can be realized.

FIGS. 1A and 1B are sectional views sequentially illustrating a conventional semiconductor fabricating method disclosed in U.S. Pat. No. 4,430,791.

Referring to FIG. 1A, an active region and a field region are defined in a P⁻ semiconductor substrate 10 by forming a field oxide film 12 by a general device isolation process. Here, a channel stop layer 14 may be formed under the field oxide film 12 to enhance device isolation characteristics.

Subsequently, a gate oxide film 16 is grown on the active region of the substrate 10 by oxidation, and then a first polysilicon layer 20, a nitride ($Si_3N_4$) film 22, and a second polysilicon layer 24 are sequentially formed on the gate oxide film 16.

Referring to FIG. 1B, the second polysilicon layer 24 is patterned by photolithography. Here, the nitride film 22 acts as an etch stop layer. Then, an insulating film is deposited on the resultant structure and etched back to form insulating film spacers 26 on the sidewalls of the patterned second polysilicon layer 24.

Then, after the second polysilicon layer 24 is removed, a gate electrode is formed by etching the underlying nitride film 22 and the first polysilicon layer 20, using the insulating film spacers 26 as an etching mask.

FIGS. 2A, 2B, and 2C are sectional views sequentially illustrating another conventional semiconductor device fabricating method disclosed in U.S. Pat. No. 4,649,638.

Referring to FIG. 2A, a pad oxide film (not shown) and a nitride film 30 are sequentially formed on a P-type semiconductor substrate 28, and an active region is defined by patterning the nitride film 30 by photolithography. Then, a field oxide film 34 is formed by thermal oxidation, using the patterned nitride film 30 as an oxidation blocking mask. During the oxidation, oxygen penetrates into a lateral surface of the pad oxide film (not shown) from under the nitride film 30 used as a mask, thereby producing a bird's beak 36 at an edge of the field oxide film 34.

Referring to FIG. 2B, the underlying field oxide film 34 is anisotropically etched by self-alignment etching, in which the nitride film 30 having the bird's beak 36 thereunder is used as an etching mask. As a result, an abutment 24 having a vertical wall 40 is produced. Then, the nitride film 30 and the pad oxide film (not shown) are removed. Here, reference numeral 42 denotes a slanted roof of the abutment 24.

Referring to FIG. 2C, a gate oxide film 44 is formed by performing an oxidation process on the resultant structure, and then a conductive layer for a gate electrode is deposited, on the gate oxide film 44. Then, a gate electrode 16 is formed on the sidewall of the abutment 24, in the form of a spacer by anisotropically etching the conductive layer.

Then, an N⁺ source/drain region (not shown) is formed by ion-implanting an N-type impurity, using the gate electrode 16 as an ion-implanting mask. At this time, a lightly doped drain (LDD) structure of a single channel is automatically formed without an additional step by ion-implantation in self-alignment with the slanted roof and the slope of the gate electrode 44.

According to the above-described conventional methods, a transistor can be formed to have a channel length equal to the width of a spacer. However, the spacer width, especially a smaller spacer width, varies to a large extent in a wafer or from wafer to wafer. Therefore, uniformity and reproductability of the channel length in the transistor cannot be ensured.

Causes of varying the spacer width will be described hereinbelow.

(1) A spacer film is non-uniformly deposited according to wafer location, chip location, ad adjacent patterns due to a gas flow and the aspect ratio of an adjacent pattern. Hence, the thickness of the spacer deposited determines its width, making the width non-uniform. For example, when a spacer film is deposited on an active region and a field region as shown in FIG. 1A, a reaction gas is applied to a substrate at different rates by CVD (Chemical Vapour Deposition), resulting in different spacer widths in both regions having different aspect ratios.

(2) Even though the spacer film is uniformly deposited, there is a difference between the etch rates of the center and an edge of a wafer during an etch-back step due to characteristics unique to anisotropical etching. Generally, the etch rate at the center of the wafer is higher than that at the edge thereof. Therefore, the spacer width at the center of the wafer is the smallest.

In addition, use of the spacer width to determine the most sensitive characteristics of a device such as the channel length of a transistor becomes a large obstacle to chip shrinkage, in the conventional methods. That is, a possibly obtained small channel length gives no benefit unless a punchthrough margin is obtained. Further, even though the punchthrough margin can be obtained, non-uniformity of device characteristics caused by short channel effects worsens the non-uniformity caused by variation of the spacer width.

SUMMARY OF THE INVENTION

Therefore, an object of the present invention is to provide a semiconductor device which employs a cell structure for which use of a spacer mask generates no serious uniformity problem to thereby contribute to maximization of cell integration.

Another object of the present invention is to provide a suitable method of fabricating the above semiconductor device.

To achieve one object of the present invention, there is provided a semiconductor device. In the semiconductor devices, a plurality of buried diffusion layers repeatedly extend on a semiconductor substrate. A plurality of word lines repeatedly extend over the buried diffusion layers, perpendicularly thereto, and have asymmetrical polygonal cross-sections, with odd-numbered word lines having the same cross-section and even-numbered word lines having the same cross-section.

It is preferred that the odd-numbered word lines have a mirror symmetry with respect to the even-numbered word lines.

According to another aspect of the present invention, there is provided a semiconductor device. In the semiconductor device having a memory cell array region and a peripheral circuit region for driving a cell, a plurality of buried diffusion layers repeatedly extend on a semiconductor substrate, as bit lines and sources/drains of cell transistors in the memory cell array region. A plurality of word lines repeatedly extend as gate electrodes of the cell transistors on the substrate having the buried diffusion layer formed thereon in the memory cell array region, perpendicularly to the buried diffusion layers. Here, the gate electrodes of the cell transistors in the memory cell array region have asymmetrical polygonal cross-sections, and the deposition structure on the gate electrodes of the cell transistors is different from that on gate electrodes of peripheral circuit transistors formed in the peripheral circuit region.

Preferably, each of the gate electrodes of the cell transistors has a mirror symmetry with respect to an adjacent gate electrode, and spacers are formed of an insulating film on the gate electrodes of the cell transistors.

To achieve the other object of the present invention, there is provided a semiconductor device fabricating method. In the method, a buried diffusion layer is formed as a source/drain on the surface of a semiconductor substrate, a gate insulating layer, a conductive layer, an etch stop layer, and a first mask layer are sequentially formed on the substrate having the buried diffusion layer formed thereon, the first mask layer is patterned perpendicularly to the buried diffusion layer, spacers are formed on the sidewalls of the patterned first mask layer by forming a second mask layer on the resultant structure and etching back the second mask layer, the first mask layer is removed, and a gate electrode is formed of the conductive layer by sequentially etching the etch stop layer and the conductive layer using the spacers as a mask.

Preferably, the etch stop layer is formed of anti-reflection material.

Preferably, the first mask layer is formed of a material having a higher etch selectivity than a material for the etch stop layer.

Preferably, the second mask layer is formed of a material having a higher etch selectivity than a material for the conductive layer.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

Figure 1A:
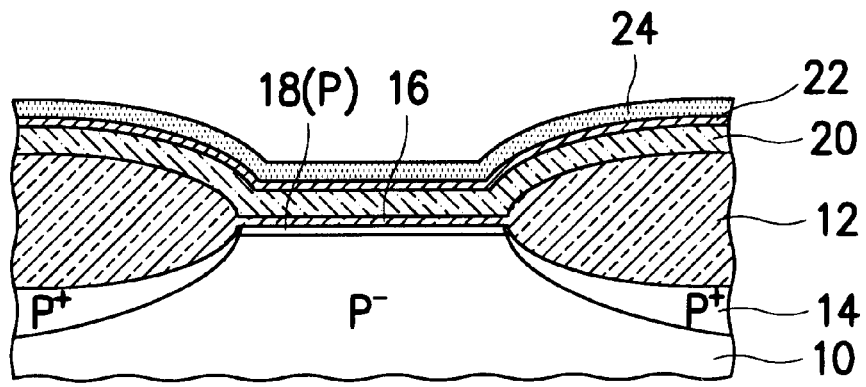
FIGS. 1A and 1B are sectional views sequentially illustrating a conventional semiconductor device fabricating method.
Figure 1B:
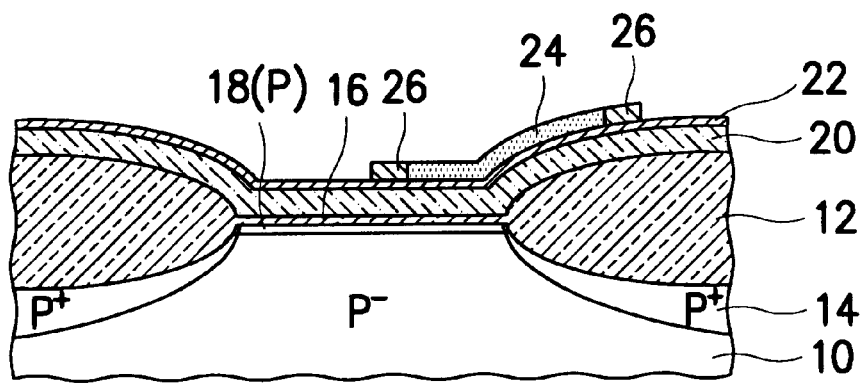
Figure 2A:
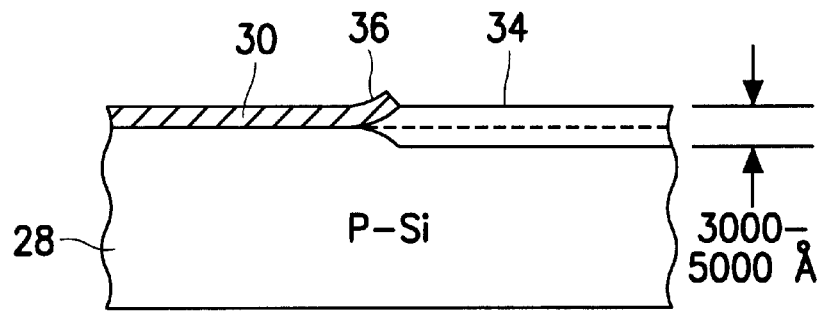
FIGS. 2A, 2B, and 2C are sectional views sequentially illustrating another conventional semiconductor device fabricating method.
Figure 2B:
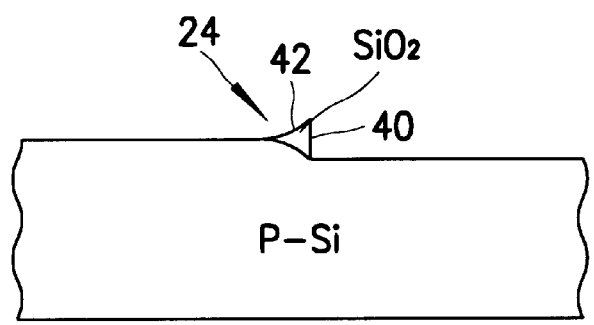
Figure 2C:
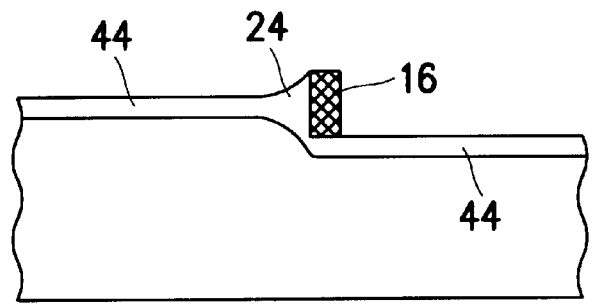
Figure 3:
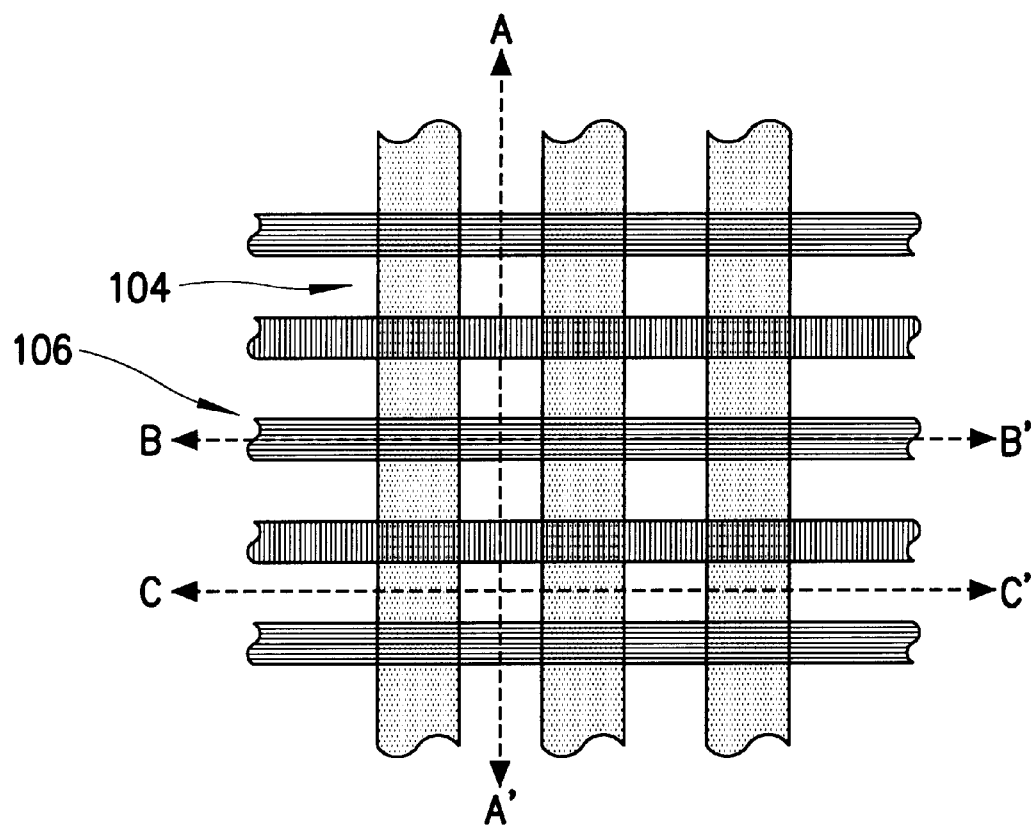
FIG. 3 is a plan view of a memory cell array region in a semiconductor device of the present invention.
Figure 4A:
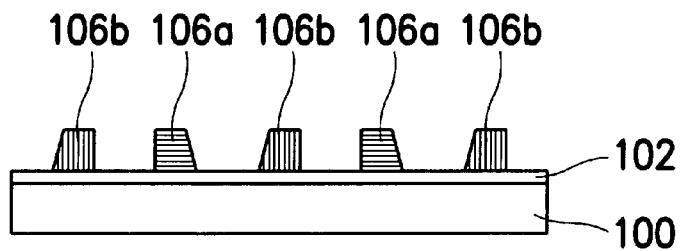
FIGS. 4A, 4B, and 4C are sectional views of FIG. 3, taken along lines A–A', B–B', and C–C', respectively.
Figure 4B:
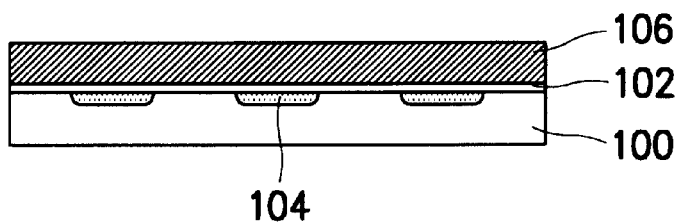
Figure 4C:
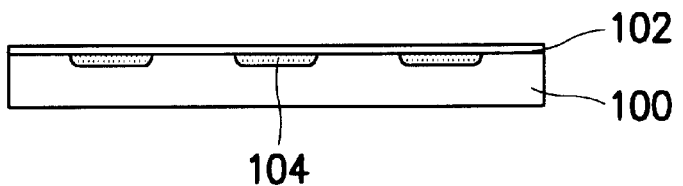

FIG. 3 is a plan view of a memory cell array region in a semiconductor device of the present invention, and FIGS. 4A, 4B, and 4C are sectional views of FIG. 3, taken along lines A–A', B–B', and C–C', respectively.

Referring to FIGS. 3 to 4C, a gate oxide film 102 and a plurality of buried $N^+$ diffusion layers 104 are formed in an active region defined by a field oxide film (not shown) in a P-type semiconductor substrate 100. The buried $N^+$ diffusion layers 104 are provided as bit lines and sources/drains of cell transistors, and repeatedly extend in a first direction A–A'. The buried $N^+$ diffusion layers 104 are formed by opening predetermined portions of the active region by photolithography and then ion-implanting an N-type impurity. Here, the distance between buried $N^+$ diffusion layers 104 corresponds to the channel length of a cell transistor.

Word lines 106 provided as gate electrodes of cell transistors extend in a second direction B–B' or C–C' perpendicular to the buried $N^+$ diffusion layers 104, overlapping with the buried $N^+$ diffusion layers 104. As shown in FIG. 4A, the word lines 106 have asymmetrical polygonal cross-sections with even-numbered word lines 106a having an identical cross-section and odd-numbered word lines 106b having an identical cross-section. In addition, the odd-numbered word lines 106b have a mirror symmetry to the even-numbered word lines 106a.

Here, the width of a word line, that is, a gate electrode 106 determines the channel width of a cell transistor. In a conventional transistor structure in which the width of a gate electrode determines the channel length of a cell transistor, a smaller width of the gate electrode made by using a spacer mask varies the channel length to a large extent due to short channel effects, and a punchthrough margin should be ensured. By contrast, in a transistor structure of the present where the width of a gate electrode determines the channel width of a cell transistor, when the width of the gate electrode varies with a variation of the channel width, only channel resistance varies. Therefore, no short channel effect-induced variation is observed, which enables cell integration to be maximized without any influence on device characteristics by forming the gate electrode 106 to be narrower on the buried $N^+$ diffusion layers 104, using a spacer mask.

The operational principle of a cell as constituted above will be described as follows.

To select and sense a specific cell, 0–2V is applied to a specific bit line. namely, a buried $N^+$ diffusion layer, a ground voltage to an adjacent buried $N^+$ diffusion layer, a voltage Vcc to a selected word line, and 0V to non-selected word lines. As a result, the specific cell is selected, and if the threshold voltage of the selected cell is lower than a voltage across the selected word line, the specific cell turns on. Thus, a current flows from the bit line to the ground. At this time, the potential of the bit line is sensed to determine data form. That is, if the current flows in the above-described manner, data is sensed as "1", whereas if the threshold voltage is higher than the voltage across the selected word line and no current flows, data is sensed as "0".

FIGS. 5A to 10B are sectional views sequentially illustrating a semiconductor device fabricating method according to a first embodiment of the present invention. Here, FIGS. 5A, 6A, ... 10A illustrate a corresponding memory cell array region, and FIGS. 5B, 6B, ... 10B illustrate a peripheral circuit region.

Figure 5A:
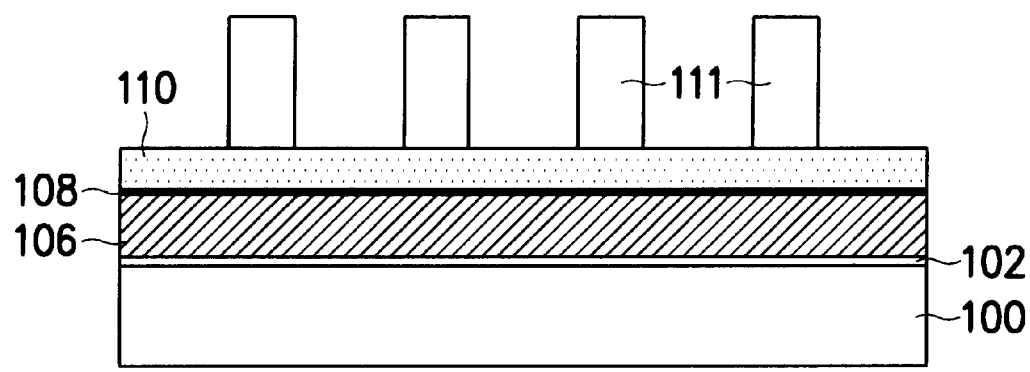
FIGS. 5A to 10B are sectional views sequentially illustrating a semiconductor device fabricating method according to a first embodiment of the present invention.
Figure 5B:
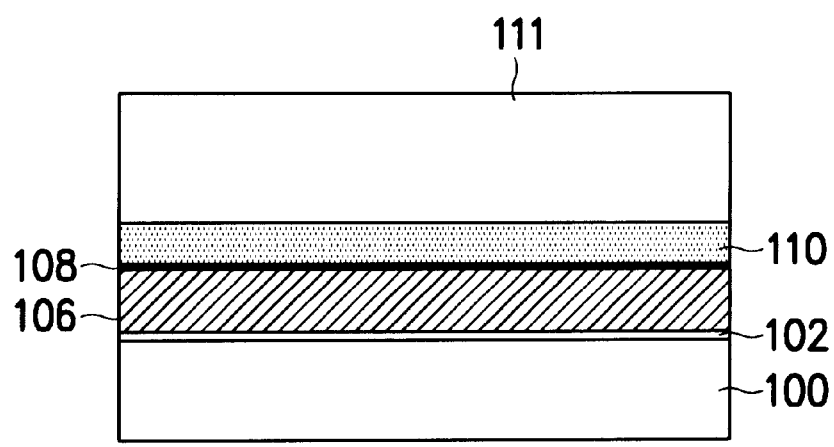

FIGS. 5A and 5B illustrate the step of forming an etch stop layer 108 and a first mask layer 110. A P-type semiconductor substrate 100 is divided into an active region and a field region by forming a field oxide film (not shown) on the substrate 100 by a general device isolation process. Then, a buried $N^+$ diffusion layer (not shown) is formed by ion-implanting an N-type impurity into the active region of a memory cell array by photolithography and ion-implantation. Here, the memory cell array region is formed on an active region.

After a gate oxide film 102 is formed on the substrate 100 having the buried $N^-$ diffusion layer formed thereon, for example, a polycide layer is formed as a conductive layer 106 for a gate electrode by depositing, for example, an impurity-doped polysilicon and tungsten silicide on the gate oxide film. Then, the etch stop layer 108 and the first mask layer 110 are sequentially deposited on the conductive layer 106. The etch stop layer 108 is preferably subjected to non-reflection processing, to minimize the influence of diffused reflection of the tungsten silicide layer for the conductive layer 106 and thus maximize resolution in a subsequent photolithography step. In addition, the etch stop layer 108 serves to prevent the surface of the tungsten silicide layer from being deformed by etching-induced damage during an etch step of the first mask layer 110. The first mask layer 110 is formed of a material having a higher etch selectivity than that of a material for the etch stop layer 108.

Subsequently, a photoresist pattern 111 is formed to cover all of the peripheral circuit region and open a predetermined portion of the memory cell array region by photolithography.

Figure 6A:
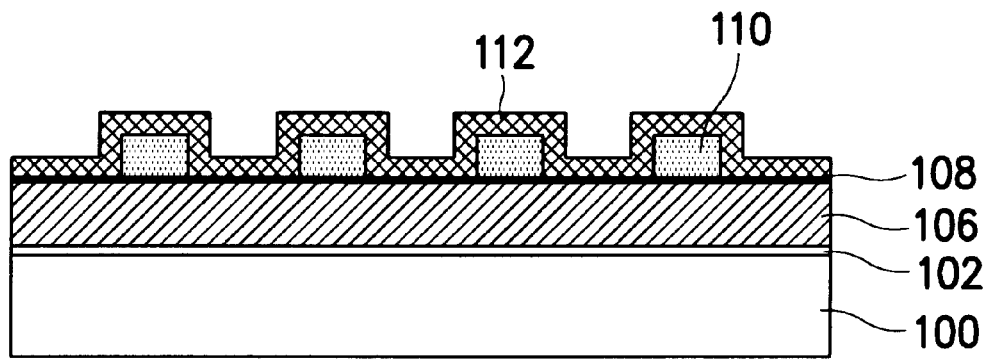
Figure 6B:
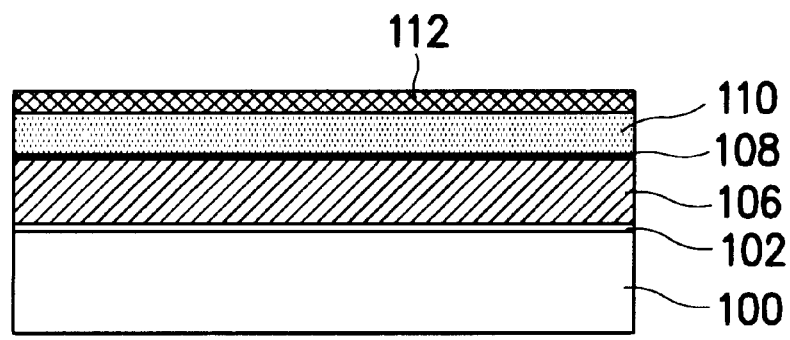

FIGS. 6A and 6B illustrate the step of forming a second mask layer 112. After the first mask layer 110 is etched with the photoresist pattern 111 used as an etching mask, the photoresist pattern 111 is removed. Then, the second mask layer 112 is formed on the resultant structure.

Figure 7A:
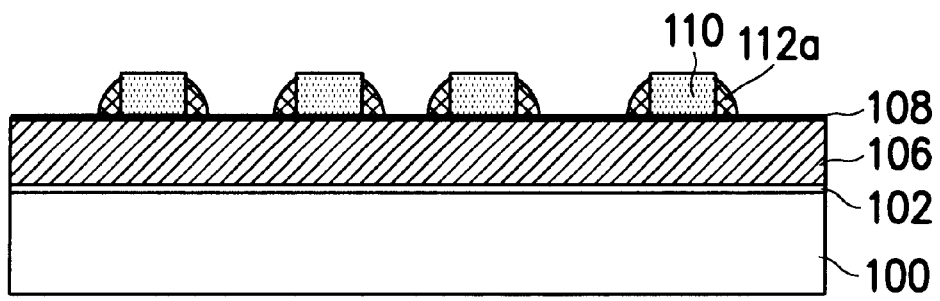
Figure 7B:
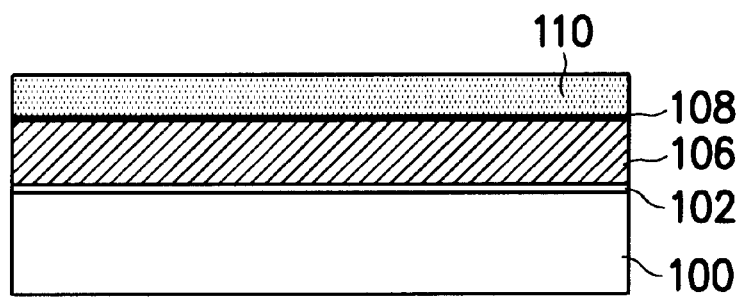

FIGS. 7A and 7B illustrate the step of etching back the second mask layer 112 and forming spacers 112a on the sidewalls of the patterned first mask layer 110. Here, the second mask layer 112 is entirely removed from the peripheral circuit region.

Figure 8A:
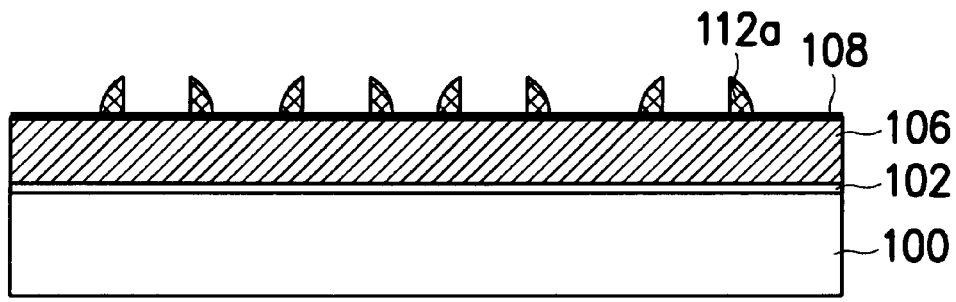
Figure 8B:
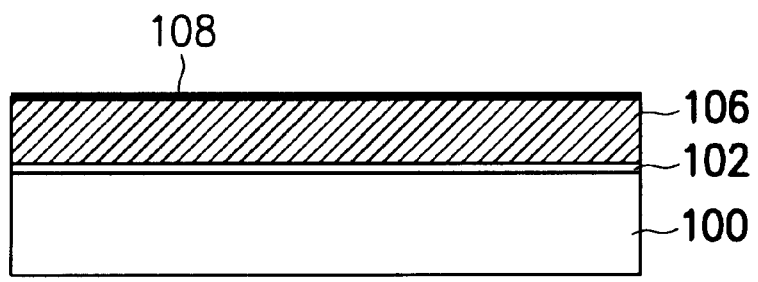
Figure 9A:
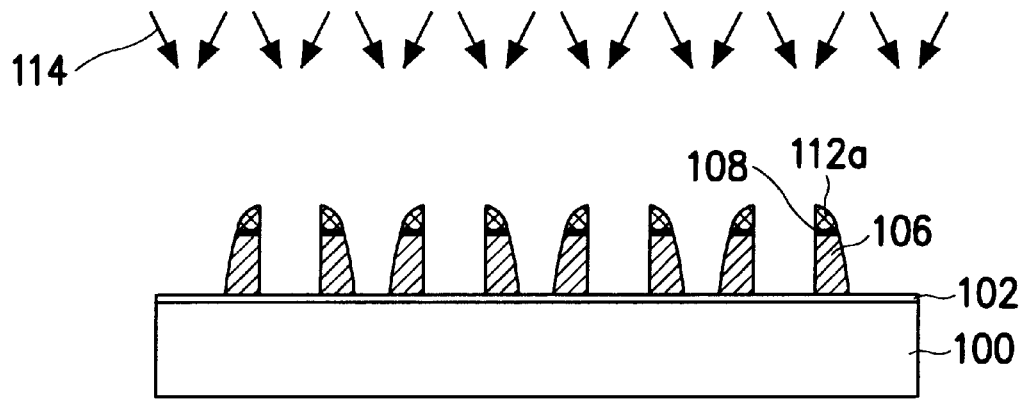
Figure 9B:
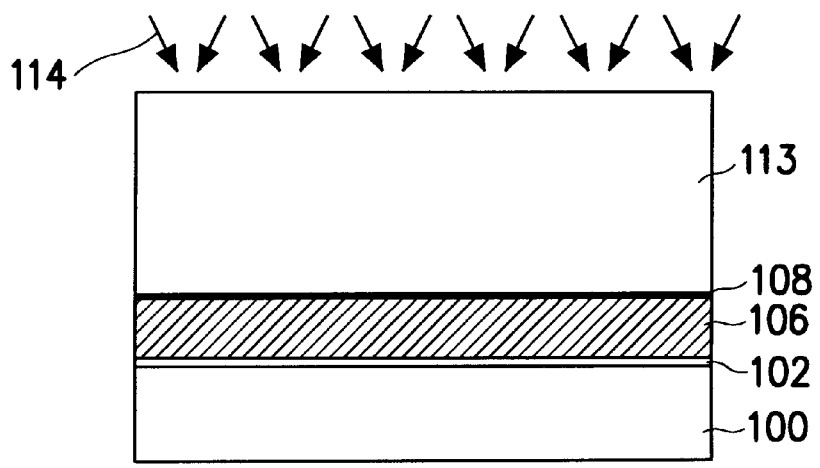

FIGS. 8A and 8B illustrate the step of removing the first mask layer 110. When the first mask layer 110 is removed, the underlying etch stop layer 108 acts to prevent the surface of the tungsten silicide layer of the conductive layer 106 from being etched, FIGS. 9A and 9B illustrate the step of forming a gate electrode in a cell transistor. After the first mask layer 110 is removed, the peripheral circuit region is covered with a photoresist pattern. 113 by photolithography. Then, a gate electrode 106 is formed for a cell transistor in the memory cell array region by sequentially etching the etch stop layer 108 and the conductive layer 106, using the spacers 112a as an etching mask. Here, the reason for covering the peripheral circuit region with the photoresist pattern 113 is that a peripheral circuit transistor does not use the buried $N^+$ diffusion layer as a source/drain, but has In LDD source/drain self-aligned with a gate electrode. Therefore, gate electrodes should be separately formed for the memory cell array region and the peripheral circuit region.

Subsequently, a P-type impurity 114 is ion-implanted into the opened memory cell array region to enhance the device isolation characteristics of a cell. The ion-implantation is performed to prevent punchthrough between the buried $N^+$ diffusion layers not covered with the gate electrode 106 (see FIG. 4C).

Figure 10A:
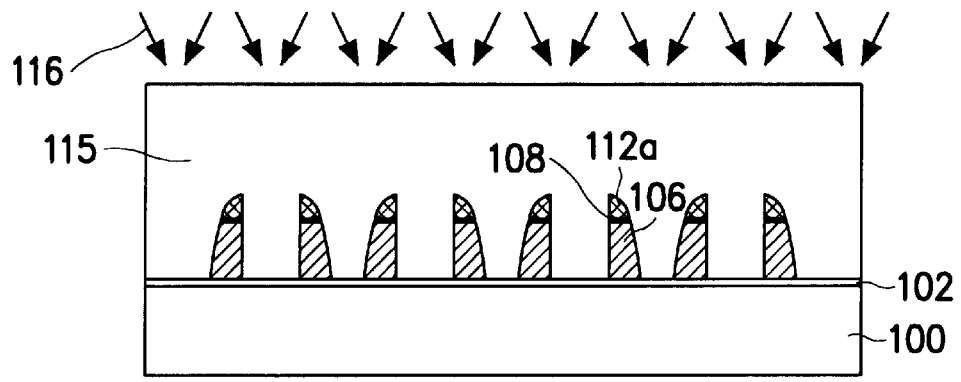
Figure 10B:
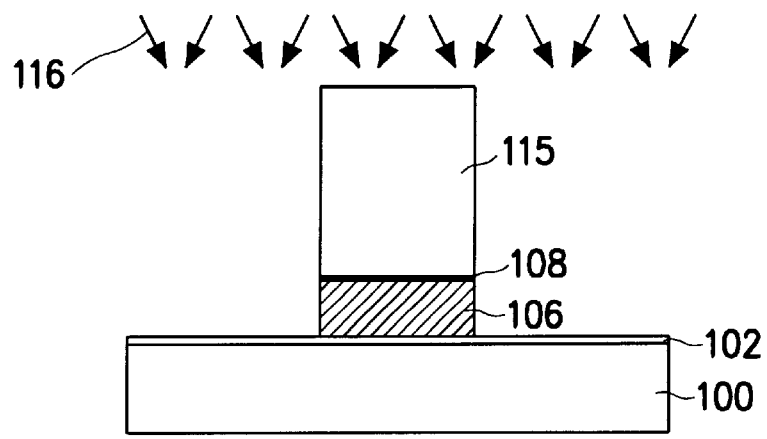

FIGS. 10A and 10B illustrate the step of forming a gate electrode for a peripheral circuit transistor. After the photoresist pattern 113 is removed, a photoresist pattern 115 is formed to cover all of the memory cell array region and a gate electrode forming portion of the peripheral circuit region by photolithography. Then, the gate electrode 106 is formed in the peripheral circuit region by etching the exposed etch stop layer 108 and conductive layer 106, using the photoresist pattern 115 as in etching mask. Then, an $N^-$ source/drain is formed in the peripheral circuit region by ion-implanting an N-type impurity 116 with the photoresist pattern 115 used as an ion-implanting mask.

Here, because the gate electrode 106 of the memory cell array region is patterned using the spacers 112a as an etching mask, the gate electrode 106 is formed in the shape of a closed curve around the first mask layer 110 in view of the formation of the spacers 112a. Therefore a band is removed from an edge of the memory cell array during the etch step of patterning the gate electrode 106 in the peripheral circuit region.

FIGS. 11A to 12B are sectional views illustrating a semiconductor device fabricating method according to a second embodiment of the present invention.

Figure 11A:
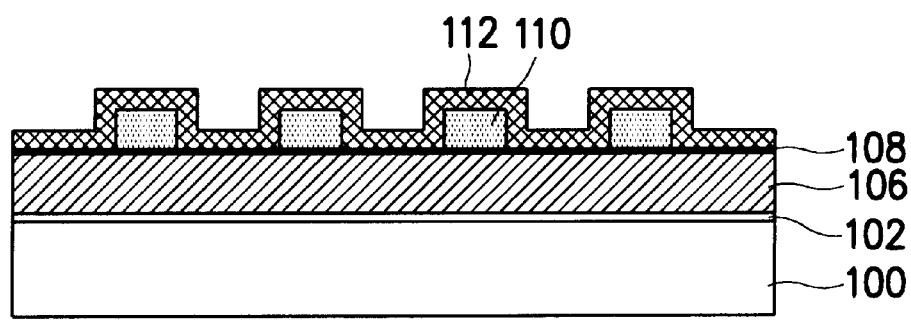
FIGS. 11A to 12B are sectional views sequentially illustrating a semiconductor device fabricating method according to a second embodiment of the present invention.
Figure 11B:
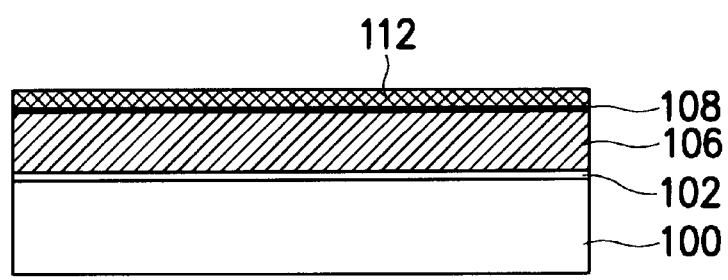

Referring to FIGS. 11A and 11B, after the first mask layer 110 is formed in the same manner as that of the first embodiment, the first mask layer 110 of the memory cell array region is patterned, while removing all of the first mask layer 110 from the peripheral circuit region. Then, the second mask layer 112 is formed on the resultant structure.

Figure 12A:
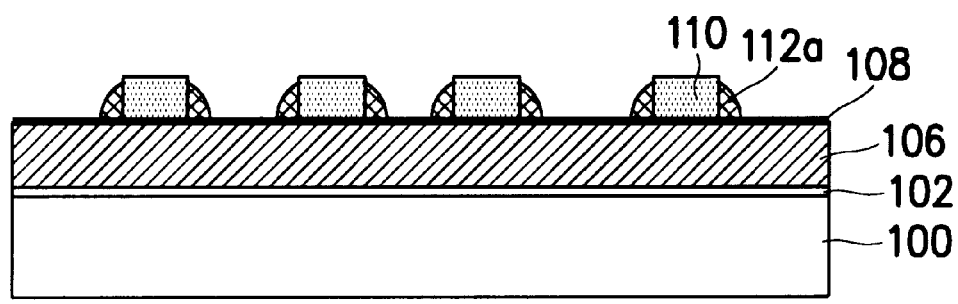
Figure 12B:
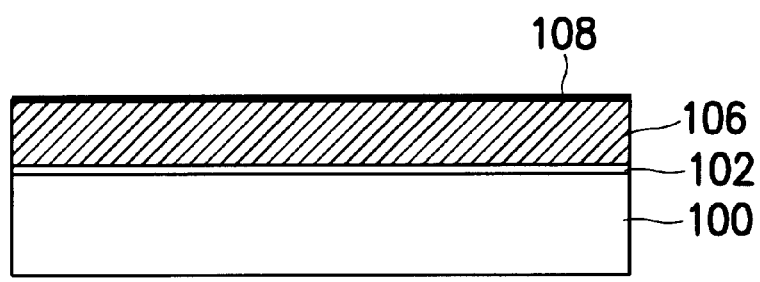

Referring to FIGS. 12A and 12B, the spacers 112 are formed of the second mask layer 112 on the sidewalls of the first mask layer 110 patterned by etching back the second mask layer 112. Here, the second mask layer 112 is entirely removed from the peripheral circuit region.

The subsequent steps are performed in the same manner as in the first embodiment.

Figure 13A:
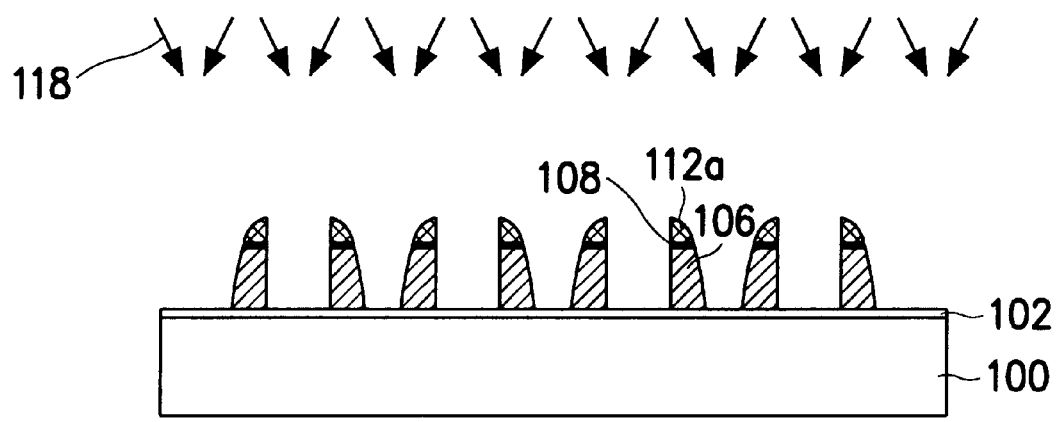
FIGS. 13A and 13B are sectional views sequentially illustrating a semiconductor device fabricating method according to a third embodiment of the present invention.
Figure 13B:
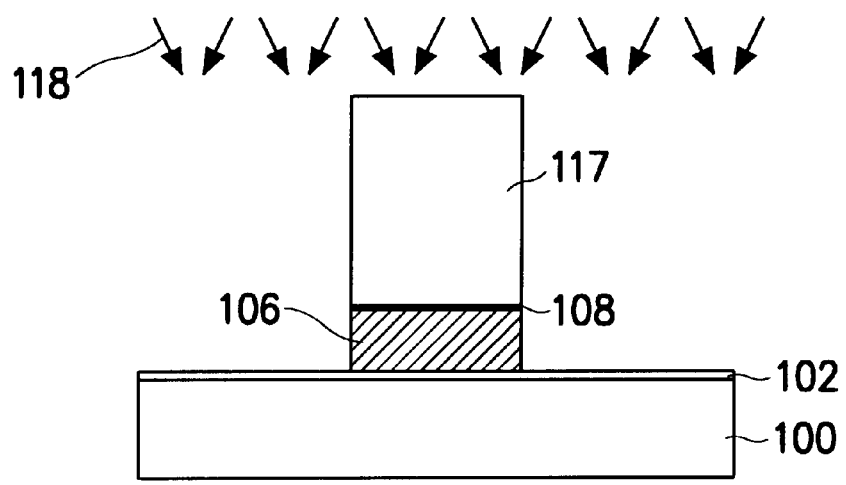

FIGS. 13A and 13B are sectional views illustrating a semiconductor device fabricating method according to a third embodiment of the present invention. In the third embodiment, the gate electrodes of the memory cell array region and peripheral circuit region are simultaneously etched. Preferably, the ion-implantation for cell device isolation may be omitted due to the increase of narrow width effects.

Referring to FIGS. 13A and 13B, after the spacer mask 112a is formed in the memory cell array region in the same manner as in the first or second embodiment, a photoresist pattern 117 is formed to cover a gate electrode forming portion of the peripheral circuit region by photolithography. Then, the gate electrode 106 is formed in the peripheral circuit region and in the memory cell array region by etching the exposed etch stop layer 108 and conductive layer 106 using the photoresist pattern 117 as an etching mask. Then, the cell device isolation characteristics can be strengthened in the memory cell array region by ion-implanting a P-type impurity 108 with the photoresist pattern 117 used as an ion-implanting mask. The above ion-implanting step may be omitted in the present invention. Here, the N⁺ source/drain can be formed to be a double diffused drain (DDD) structure in the peripheral circuit region.

The following table shows combinations of an etch stop layer, and first and second mask layers used in the present invention.

|  | I | II | III | IV | V |
|---|---|---|---|---|---|
| first mask layer | O₃-TEOS (1500–3000Å) | Poly (1500–3000Å) | P—SiO₂ (1500–3000Å) | P—Si₃N₄ (1500–)3000Å) | PR (0.6 μm) |
| second mask layer | P—Si₃N₄ (1500–5000Å) | P—SiO₃ (1500–5000Å) | P—Si₃N₄ (1500–5000Å) | P—SiO₂ (1500–5000Å) | LT P-oxide (2000–3000Å) |
| etch stop layer | Poly (500Å) | SiON (260Å) | Poly present/absent | Poly present/absent | SiON (260Å) |

In case I, an etch stop layer of polysilicon reliably performs an etch-stop function when first and second mask layers are etched, and a stable spacer mask can be formed due to a high wet etch rate of O₃-TEOS in removing the first mask layer. The wet etch rate of an O₃-TEOS oxide film is very high, i.e., 3000 Å/min, thereby preventing the profile of the second mask layer from being deformed when the first mask layer is removed.

In case II, the etch-stop function is not reliably performed when a spacer is formed by etching back the second mask layer because the difference between of the etch rates of an SiON etch stop layer and a P—SiO₂ second mask layer is not large. In addition, when the first mask layer of polysilicon is removed, the surface of the tungsten suicide layer of the gate electrode is exposed, and thus may be damaged during the etch. Even though the surface of the tungsten silicide layer is not exposed, the P—SiO₂ layer remains on the first mask layer due to deposition characteristics of P—SiO₂, and the first mask layer may not be entirely removed.

In case III, a stable P—Si₃N₄ spacer can be formed by increasing the etch selectivities of P—SiO₂ and P—Si₃N₄ when the first mask layer is removed.

In case IV, a stable P—SiO₂ spacer can be formed by, for example, phosphoric acid (H₃PO₄) etching, by increasing the etch selectivities of P—SiO₂ and P—Si₃N₄ when the first mask layer is removed.

In case V, after the first mask layer of photoresist is patterned, LT P-oxide spacers are formed on both sidewalls of the photoresist pattern. Thus, the first mask layer of photoresist is easily removed, and its fabrication is the easiest of the above cases. However, the photoresist is highly vulnerable to deformation due to a high temperature used for depositing an LT P-oxide film after patterning of the photoresist. Therefore, the profile of the second mask layer is bad, and the second mask layer is expected to have a great height in consideration of the height of the photoresist usually used, that is, 0.5–1.5 μm. As a result, when a narrow spacer is formed, the width of the spacer will vary to a large extent.

As determined by the present inventor, two gate electrodes are formed to have a width of 0.13 μm in a given pitch of 0.65 μm by forming a first mask layer having a pattern pitch of 0.65 μm in an i-line exposure equipment and then forming a gate electrode by using spacers according to the sequence of fabricating steps as described with reference to the embodiments. Therefore, the gate electrodes have a very small line width of 0.13 μm, and a related line width variation is expected to be about 10%). In addition, reduction of the gate electrodes, that is, word lines increases resistance, and may cause signal delay, which is negligible because reduction of the capacitance of the word lines to a substrate due to the gate oxide film counterbalances a resistance increment.

According to the present invention as described above, a gate electrode of a cell transistor is formed to have an asymmetrical polygonal cross-section and a mirror symmetry with respect to an adjacent gate electrode. The gate electrode is disposed perpendicularly to a buried diffusion layer for a source/drain, and its width determines the channel width of the cell transistor. Thus, the area of a cell array can be reduced by 50% to maximize a cell integration level by forming a narrower gate electrode on the buried diffusion layer using a spacer mask. In addition, the number of additional steps can be minimized to thereby increase product yield.

While the present invention has been described and illustrated in detail with reference to the specific embodiments, it is to be clearly understood that many variations can be made by anyone skilled in the art within the scope and spirit of the present invention.

What is claimed is:

1. A semiconductor device comprising:
   a plurality of buried diffusion layers repeatedly extending on a semiconductor substrate; and
   a plurality of word lines repeatedly extending over the buried diffusion layers perpendicularly thereto, and having asymmetrical polygonal cross-sections, with odd-numbered word lines having the same cross-section and even-numbered word lines having the same cross-section.

2. A semiconductor device comprising:
   a plurality of buried diffusion layers extending on a semiconductor substrate; and
   a plurality of word lines extending perpendicular to the buried diffusion layers and having asymmetrical polygonal cross-sections, odd-numbered word lines having a first cross-section and even-numbered word lines having a second cross-section;
   wherein the odd-numbered word lines have a mirror symmetry with respect to the even-numbered word lines.

3. A semiconductor device having a memory cell array region and a peripheral circuit region for driving a cell comprising:
   a plurality of buried diffusion layers repeatedly extending on a semiconductor substrate, as bit lines and sources/drains of cell transistors in the memory cell array region; and
   a plurality of word lines repeatedly extending as gate electrodes of the cell transistors on the substrate having the buried diffusion layer formed thereon in the memory cell array region, perpendicularly to the buried diffusion layers,
   wherein the gate electrodes of the cell transistors in the memory cell array region have asymmetrical polygonal cross-sections, and the deposition structure on the gate electrodes of the cell transistors is different from that on gate electrodes of peripheral circuit transistors formed in the peripheral circuit region.

4. A semiconductor device having a memory cell array region and a peripheral circuit region for driving a cell, the memory cell array region having a plurality of cell transistors, the device comprising:
   a plurality of buried diffusion layers extending on a semiconductor substrate, the diffusion layers forming bit lines, source regions, and drain regions of the plurality of cell transistors; and
   a plurality of word lines extending perpendicularly to the plurality of buried diffusion layers, the plurality of word lines forming gate electrodes of the plurality of cell transistors,
   wherein the gate electrodes of the cell transistors have asymmetrical and polygonal cross-sections; and
   deposition structures on the gate electrodes of the cell transistors is different from deposition structures on gate electrodes of peripheral circuit transistors formed in the peripheral circuit region;
   wherein each of the gate electrodes of the cell transistors formed in the memory cell array region have a mirror symmetry with respect to an adjacent gate electrode.

5. The semiconductor device of claim 4 wherein spacers are formed of an insulating film on the gate electrodes of the cell transistors.

6. A method for fabricating semiconductor devices, comprising:
   forming a buried diffusion layer as a source/drain region on the surface of a semiconductor substrate;
   sequentially forming a gate insulating layer, a conductive layer, an etch stop layer, and a first mask layer on the substrate having the buried diffusion layer formed thereon;
   forming a first photoresist pattern on portions of a memory cell array region of the substrate and entirely on a peripheral circuit region;
   patterning the first mask layer perpendicularly to the buried diffusion layer in the memory cell array region;
   forming a second mask layer on the patterned first mask layer in the memory cell array region and on the first mask layer in the peripheral circuit region;
   forming spacers on the sidewalls of the patterned first mask layer of the memory cell array region by etching back the second mask layer;
   removing the second mask layer from the peripheral circuit region;
   removing the first mask layer from the memory cell array and peripheral circuit regions;
   forming a gate electrode in the memory cell array region by sequentially etching the etch stop layer and the conductive layer using the spacers as a mask; and
   forming a gate electrode in the peripheral circuit region by etching the etch stop layer and the conductive layer.

7. The method of claim 6 including:
   forming a second photoresist pattern over the peripheral circuit region before forming the gate electrode in the memory cell array region;
   removing the second photoresist pattern after forming the gate electrode in the memory cell array region; and
   forming a third photoresist pattern over the memory cell array region and over portions of the peripheral circuit region before forming the gate electrode in the peripheral circuit region.

8. A method for fabricating semiconductor devices, comprising:
   forming a buried diffusion layer as a source/drain region on the surface of a semiconductor substrate;
   sequentially forming a gate insulating layer, a conductive layer, an etch stop layer, and a first mask layer on the substrate having the buried diffusion layer formed thereon;
   patterning the first mask layer perpendicularly to the buried diffusion layer;
   forming spacers on the sidewalls of the patterned first mask layer by forming a second mask layer on the resultant structure and etching back the second mask layer;
   removing the first mask layer; and
   forming a gate electrode on the conductive layer by sequentially etching the etch stop layer and the conductive layer using the spacers as a mask;
   wherein the etch stop layer is formed of a reflection blocking material.

9. The method of claim 8 wherein the first mask layer is formed of a material having a higher etch selectivity than a material used to form the etch stop layer.

10. The method of claim 8 wherein the second mask layer is formed of a material having a higher etch selectivity than a material used to form the conductive layer.

11. A method for fabricating a semiconductor device having a memory cell array region in which a plurality of cell transistors is formed and a peripheral circuit region which drives a cell, said method comprising:
   (a) forming a buried diffusion layer as source/drain regions of said cell transistor on the surface of a semiconductor substrate;
   (b) sequentially forming a gate insulating layer, a conductive layer, an etch stop layer and a first mask layer on the semiconductor substrate having said buried diffusion layer formed thereon;
   (c) patterning said first mask layer of the memory cell array region perpendicularly to said buried diffusion layer;
   (d) forming spacers on the sidewalls of said patterned first mask layer by forming a second mask layer on the resultant structure and by etching back said second mask layer;
   (e) removing said first mask layer;
   (f) forming a gate electrode of said cell transistor on the conductive layer by sequentially etching said etch stop layer and said conductive layer by use of said spacers as masks; and
   (g) forming a gate electrode of the peripheral circuit transistor on the conductive layer by patterning said etch stop layer and conductive layer in said peripheral circuit region.

12. A method for fabricating a semiconductor device having a memory cell array region in which a plurality of cell transistors is formed and a peripheral circuit region for driving a memory cell, the method comprising:
   (a) forming a buried diffusion layer as source/drain regions of one of the plurality of cell transistors on a semiconductor substrate;
   (b) sequentially forming a gate insulating layer, a conductive layer, an etch stop layer, and a first mask layer on the semiconductor substrate;
   (c) patterning the first mask layer perpendicularly to the buried diffusion layer;

(d) forming spacers on the sidewalls of the patterned first mask layer by forming a second mask layer on the resultant structure and etching back the second mask layer;

(e) removing the first mask layer;

(f) forming a gate electrode of the cell transistor on the conductive layer by sequentially etching the etch stop layer and the conductive layer using the spacers as masks; and (g) forming a gate electrode of a peripheral circuit transistor on the conductive layer by patterning the etch stop layer and conductive layer in the peripheral circuit region;

wherein the etch stop layer is formed of an anti-reflection material.

13. The method of claim 12 wherein the first mask layer is formed of a material having a higher etch selectivity than the etch layer.

14. The method of claim 12 wherein the second mask layer is formed of a material having a higher etch selectivity than the conductive layer.

15. The method of claim 12 wherein patterning the first mask layer comprises removing the first mask layer of the peripheral circuit region.

* * * * *

UNITED STATES PATENT AND TRADEMARK OFFICE
CERTIFICATE OF CORRECTION

PATENT NO.    : 6,207,490 B1
DATED         : March 27, 2001
INVENTOR(S)   : Woon-Kyung Lee It is certified that error appears in the above-identified patent and that said Letters Patent is hereby corrected as shown below:

Column 2,
Line 29, "location, ad adjacent" should be -- location, and adjacent --.

Column 5,
Line 26, "buried N- diffusion" should be -- buried N+ diffusion --.

Column 6,
Line 3, "has In LDD" should be -- has an LDD --.

Column 6,
Line 21, "as in etching" should be -- as an etching --.

Column 7,
Line 17, "P—SiO3" should be -- P—SiO2 --.
Line 37, "suicide" should be -- silicide --.

Column 8,
Line 6, "about 10%)." should be -- about 10%. --.

Signed and Sealed this

Twenty-sixth Day of November, 2002

Attest:

JAMES E. ROGAN
Attesting Officer          Director of the United States Patent and Trademark Office